United States Patent [19]

Assard

[11] Patent Number: 4,973,898

[45] Date of Patent: Nov. 27, 1990

[54] DIGITAL SPECTRAL NORMALIZER

[75] Inventor: Gerald L. Assard, Waterford, Conn.

[73] Assignee: The United States of America as represented by the Secretary of the Navy, Washington, D.C.

[21] Appl. No.: 642,204

[22] Filed: Dec. 18, 1975

[51] Int. Cl.$^5$ .................. G01R 23/16; G01R 27/02
[52] U.S. Cl. .................................................. 324/77 H
[58] Field of Search .................. 324/77 B, 77 E, 77 H

[56] References Cited

U.S. PATENT DOCUMENTS

| | | | |
|---|---|---|---|
| 3,717,812 | 2/1973 | Hirsch | 324/77 B |
| 3,855,423 | 12/1974 | Brendzel et al. | 324/77 B |

*Primary Examiner*—Theodore M. Blum
*Attorney, Agent, or Firm*—Michael J. McGowan; Prithvi C. Lall

[57] ABSTRACT

A digital spectral normalizer for subtracting out the mean of an input signal to be normalized to obtain a normalized output signal. The normalizer comprises a variable gain amplifier which adjusts the input level to fall within the dynamic range of an analog to digital converter. The output of the digital converter propagates along two paths, i.e. one path used to drive a first digital to analog converter which provides the analog levels to a first low pass filter to obtain the mean of the input signal and the second path used to delay the output of the digital converter by an amount selected in a digital delay line to match the inherent delay of the mean signal traveling via the first path. The delayed signal drives a second analog to digital converter, the output of which passes through a second low pass filter of relatively high frequency, restoring the quantized waveform back to continuous analog signal. The mean signal is then subtracted from the delayed signal in the output amplifier to obtain the normalized output signal.

6 Claims, 2 Drawing Sheets

DIGITAL SPECTRAL NORMALIZER

BACKGROUND OF THE INVENTION

This invention relates to spectral normalizers and more particularly to a wide dynamic range post-processing digital normalizer.

Various types of displays employing means for varying the intensity to denote various levels in the amplitude of signals are referred to as intensity modulated displays (IMD). However, it is not possible to maintain the recognition differential necessary for spectral detection over a large dynamic range on an intensity modulated display without employing a means of normalizing. This is due to the presence of noise signals of variable intensity in different parts of the frequency spectrum. As an example, it has been found that the resolution of the frequency spectrum at an intensity modulated display (IMD) is limited to about eight shades of gray, ranging from black to white, which are discernible by a naked eye. When it is necessary to maintain recognition differential using only eight gray levels, the dynamic range between insufficient signal strength corresponding to the white color region and to the overloaded signal strength corresponding to the black color region is limited. It is thus desirable to employ means which make it possible to maintain recognition differential while displaying spectral signals of a large dynamic range on an IMD.

SUMMARY OF THE INVENTION

The digital spectral normalizer of the present invention is an electronic system wherein the input signals and the noise after processing thereof and having a wide dynamic range are normalized to increase the dynamic range of the spectral data on an intensity modulated display. The spectral normalizer comprises a variable gain amplifier which adjusts the input level to fall within the dynamic range of an analog to digital converter. The output of the analog to digital converter is then made to propagate along two paths, i.e., one path driving a first digital to analog converter which provides the analog levels into a first low pass filter to obtain the mean of the input signal and the second path wherein the signal passes through a digital delay line before driving a second digital to analog converter. The delay selected in the digital delay line is used to match the inherent delay of the mean signal following the first path. The delayed signal drives a second digital to analog converter the output of which passes through a second low pass filter of relatively high frequency to restore the quantized waveform back to continuous analog signal. The mean signal is then subtracted from the delayed signal in an output amplifier to obtain the normalized output signal. The normalized signal which is the output of the output amplifier maintains recognition differential while displaying spectral signals of a wide dynamic range. Thus the noise signals of variable intensity as a function of frequency are also normalized which allows the detection of incoming signals of different frequencies on an intensity modulated display and increases the dynamic range of the spectral data.

One object of the subject invention is to provide a post-processing spectral normalizer to increase the dynamic range of the spectra data.

Another object of this invention is to provide a spectral normalizer wherein the normalized display makes spectral detection equally likely in any part of the spectrum of the input signals.

Still another object of subject invention is to improve the usefulness of an intensity modulated display system by normalizing the incoming signals.

Still another object of subject invention is to allow the spectral display of an incoming signal to be optimized and thus the full spectrum is represented within the full set of the detection by a naked eye.

Still another object of subject invention is to improve the display of input signals after the spectral analysis thereof.

Other objects, advantages, and novel features of this invention will become apparent from the following detailed description of the invention when considered in conjunction with the accompanying drawings wherein:

DESCRIPTION OF A PREFERRED EMBODIMENT

Figure 1:
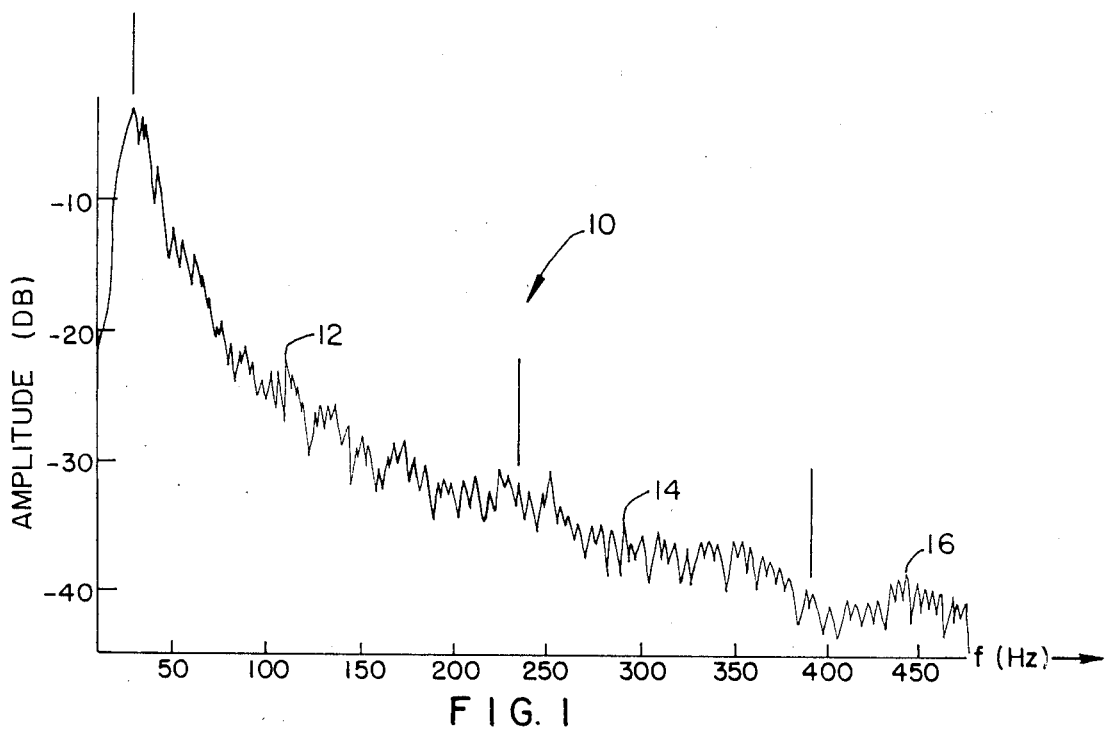
FIG. 1 is a typical spectrum representation of low frequency noise from the sea together with the real signal.
Figure 2:
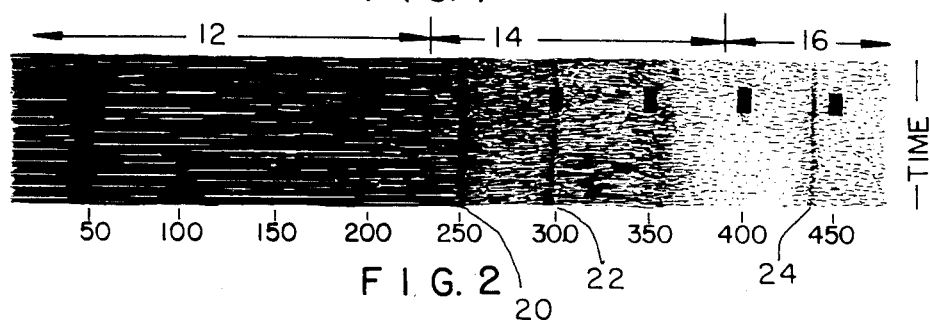
FIG. 2 is an unnormalized intensity modulated display of the spectrum of FIG. 1.
Figure 3:
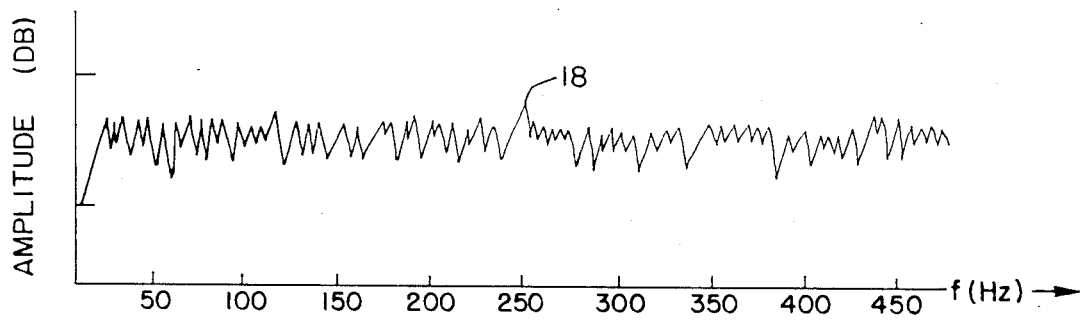
FIG. 3 is a representation of the normalized spectrum of the low frequency noise shown in FIG. 1.
Figure 4:
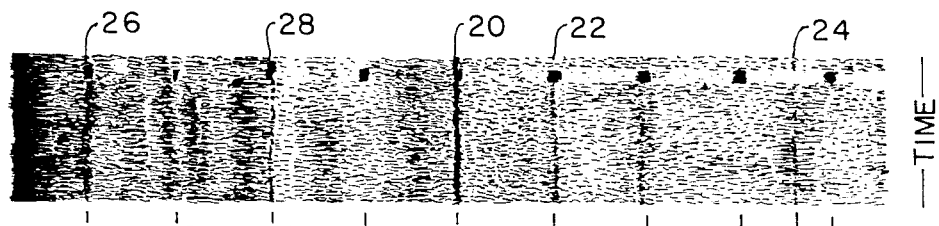
FIG. 4 is normalized intensity modulated display of the normalized spectrum shown in FIG. 3.
Figure 5:
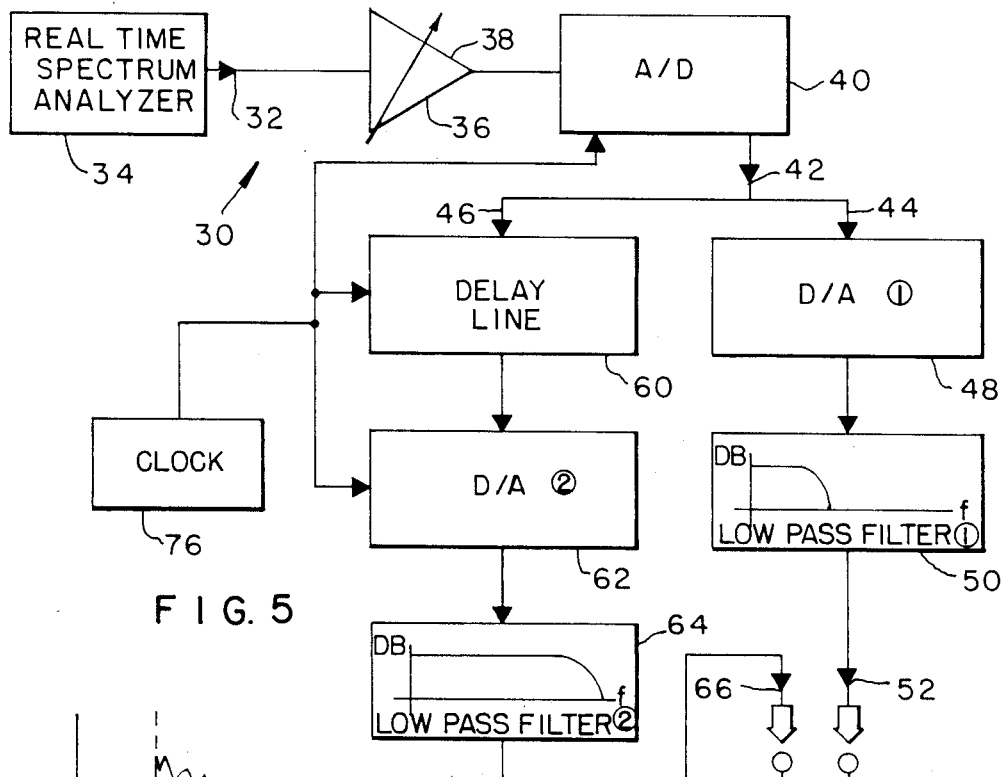
FIG. 5 is a block diagram of a digital spectrum normalizer.
Figure 6:
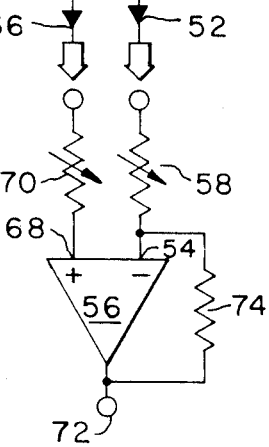
FIG. 6 is an illustration of the analog signal levels at different stages of the normalizing process.
Figure 6:
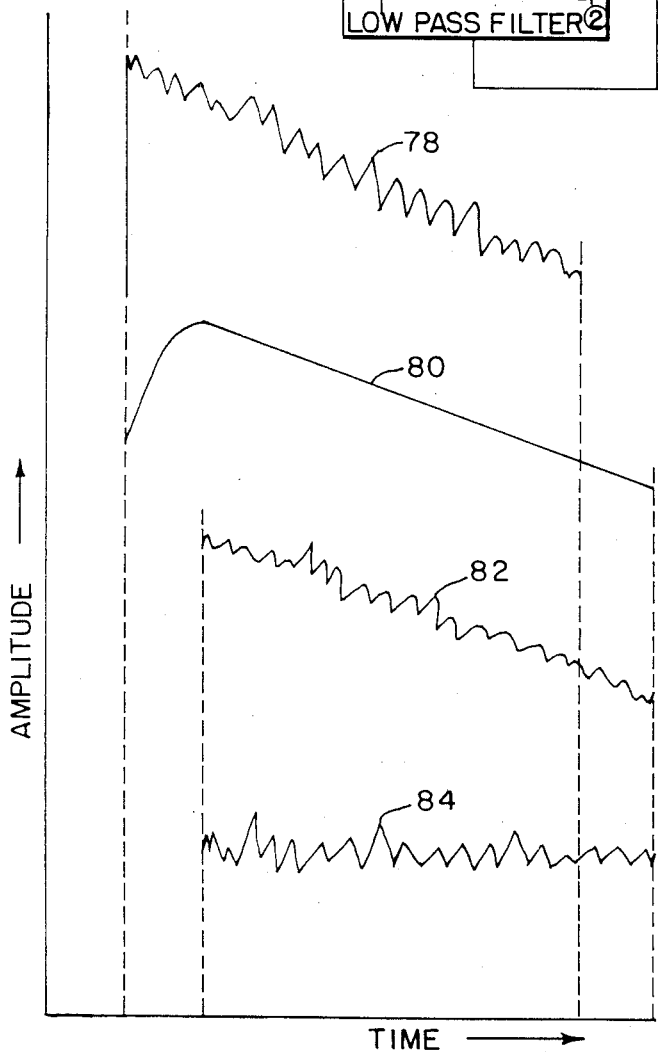

Referring to the drawings wherein like reference characters designate like parts throughout, there is shown in FIG. 1 a typical representation of a spectrum low frequency noise from the sea. This also is the output of a spectral processor or analyzer and the signal includes the real signal to be detected from a target together with the low frequency noise from various sources in the sea. As shown in FIG. 1, curve 10 is a graphical representation of the amplitudes of the incoming signals including the noise from the sea against the frequency. It represents the output of a spectral processor or analyzer such as Spectral Dynamics Corp. Real Time Analyzer Model 301. FIG. 2 represents an unnormalized intensity modulated display of the output of a spectral processor as displayed on an intensity modulated display system such as a storage oscilloscope, Tektronix Model 611. From the comparison of FIGS. 1 and 2, it can be seen that a normalized intensity modulated display of FIG. 2 essentially includes three regions; i.e., black region 12 which is intensity saturated due to the low frequency noise, gray region 14 corresponding to the relatively low intensity of the noise from the sea and generally white region 16 corresponding to the lowest intensity of the noise. It can also be seen from FIGS. 1 and 2 that the tonals 20, 22 and 24 corresponding to line frequencies at 250 Hz, 300 Hz and 440 Hz respectively are quite pronounced when viewing the intensity modulated display. However, all spectral data are lost in region 12 in the black area below 250 Hz as this area is intensity saturated to such an extent that no spectral data can be observed in that region. However, by normalizing the spectrum of FIG. 1, a relatively flat spectrum shown by curve 18 in FIG. 3 is obtained. Normalized spectrum of FIG. 3 as displayed on an intensity modulated display is shown in FIG. 4 where tonals 20, 22, 24, and additional tonals 26 and 28 appear at frequencies 250 Hz, 300 Hz, 440 Hz, 50 Hz and 150 Hz respectively. This is accomplished without viewing additional intensity modulated displays for the three spectral areas of 0-50 Hz, 50-150 Hz and 150-250 Hz or without reorienting the eight gray levels of a single intensity modulated display at the expense of the other two spectral areas. The process of normalization of the output of a real time spectral analyzer such as Spectral Dynamics Model 301 is shown in a block diagram in FIG. 5. Output 32 of a real time spectrum analyzer 34 is used to drive a variable gain amplifier 36 to adjust the level of the input signal so that its level can remain within the dynamic range of the A/D (analog to digital) converter 40. Output 42 of A/D 40 is routed through two paths 44 and 46. Output 42 traveling via path 44 is used to drive a digital to analog (D/A 1) converter 48, the output of which is used as an input to low pass filter 50 of relatively low cutoff frequency. The output 52 of the low pass filter 50 is connected to terminal 54 of output amplifier 56 through a variable resistor 58. The output 42 traveling via path 46 is delayed by means of digital delay line 60 in order to match the inherent delay caused in the signal traveling via path 44 mainly due to low pass filter 50. The output of the delay line 6 is passed through a D/A converter 62 (D/A 2) and is then passed through low pass filter 64 which has relatively higher cutoff frequency than that of low pass filter 50..The output 66 of low pass filter 64 is connected to terminal 68 of output amplifier 56 through a variable resister 70. The output terminal 72 of output amplifier 56 is connected to terminal 54 thereof through feedback resistor 74. It is to be noted that the use of analog to digital converter 40 also insures that the amplitude of level presented to low pass filter 50 and low pass filter 64 is the same. FIG. 6 shows the representation of the signal at different stages of the normalizing process accomplished in the cirucit shown in a block diagram form in FIG. 5. Curve 78 represents the unnormalized signal including the incoming signal and the noise from the sea. Numeral 80 represents the output of the low bandpass filter 50 and is the mean of the output of the real time spectrum analyzer. Curve 82 represents the output of low bandpass filter 64 and curve 84 of FIG. 6 represents the output of output amplifier 56 at output terminal 72 thereof. The output at terminal 72 is then used for energizing an intensity modulated display such as a storage oscilloscope, Tektronix Model 611.

In operation, the signal from spectral analyzer 34 which contains the real signal and the noise from the sea is used as an input for variable gain amplifier 36 in order to bring the input level to fall within the dynamic range of the various components of the circuit. The output of A/D 40 traveling via path 44 is brought back to its corresponding analog levels before passing through low pass filter having a low cutoff frequency. Low pass filter 50 smooths the signal traveling via path 44 and presents, as an output, the mean of the signal coming from real time spectrum analyzer 34. It is to be noted that low pass filter 50 acts as an integrator and extracts the envelope of the signal and because of the low cutoff frequency and therefore the large time constant (RC) the signal traveling via path 44 is inherently delayed to a large extent. The output 42 traveling via path 46 is appropriately delayed by using digital delay line 60, the output of which is converted into its corresponding analog levels by D/A converter 62. The output of D/A 62 is then passed through low pass filter 64 having a cutoff frequency which is higher than the cutoff frequency of low pass filter 50 and thus obtaining the output of real time spectrum analyzer 34 properly delayed to match in delay the output of low pass filter 50. The outputs of low pass filters 50 and 72 are summed together in output amplifier 56 where the mean of the incoming signal, i.e., the output of low pass filter 50 cancels the corresponding component in the output of low pass filter 64 and leaves a normalized output at terminal 72 which is used for displaying on an intensity modulated display system. Clock 76 provides the rate of sampling the data and has frequency substantially greater than the highest frequency component present in the spectrum. A typical display of this type is shown in FIG. 4 which clearly indicates the presence of tonals frequencies 50 Hz and 150 Hz which were buried in the intensity saturated region 12 of FIG. 2. The amount of delay introduced by low pass filter 64 in the delayed signal traveling path 46 is negligible as compared to the delay caused by low pass filter 50 in path 44. Variable resistors 58 and 70 are used for adjusting the signal levels for complete cancellation. Resistor 74 is used as a feed back resistor and sets up the gain of amplifier 56.

It should be noted that all the electronic components or units used in the digital spectral normalizer built according to the teachings of subject invention are well known in the art. For example, the real time spectrum analyzer used was Spectral Dynamics Corp. Model 301; analog to digital converter and digital to analog converter used were Hybrid Systems Inc. Model Nos. ADC 590-8 and DAC 371-8 respectively; digital delay line and the clock used were made based upon Transistor-Transistor Logic (TTL); operational amplifiers used were standard units such as U5B7741312; and low pass filters used were of Butterworth design. However, all these components or units may be substituted by equivalent units without deviating from the teachings of subject invention.

Briefly stated, a digital spectral analyzer built according to the teachings of this invention comprises a variable gain operational amplifier which amplifies the output of a spectrum analyzer to stay within the dynamic range of various electronic units used, an analog to digital converter (A/D) to digitize the output of the operational amplifier. The output of the A/D is routed via two paths; one used to reconvert the signal into its analog levels using a first digital to analog converter (D/A) and then obtain the mean thereof by a first low pass filter having a low cutoff frequency and the second path used to delay the digitized output of the A/D and reconverting the output of the digital delay line into corresponding analog levels using a second digital to analog converter (D/A) and pass the output of the D/A through a second low pass filter having cutoff frequency greater than the cutoff frequency of the first low pass filter. The signals travelling the two paths are then summed in another operational amplifier to obtain a normalized signal at the output terminal thereof Obviously many modifications and variations of the present invention are possible in the light of the above teachings. As an example, various electronic components used can be substituted by their equivalents. It is therefore understood that within the scope of the appended claims the invention may be practiced otherwise than as specifically described.

I claim:

1. A digital spectral normalizer for normalizing the output of a spectral analyzer for displaying on an intensity modulated display which comprises:
   a first amplifying means for amplifying the output of the spectral analyzer, said first amplifying means using the output of the spectral analyzer as an input thereof;
   an analog to digital converter for digitizing the output of said first amplifying means, the output of said first amplifying means being used as an input to said analog to digital converter;
   a first digital to analog converter for obtaining analog levels corresponding to the output of said analog to digital converter using a first path, said first digital to analog converter using the output of said analog to digital converter as an input;
   averaging means for aveaging the output of said first digital to analog converter and thus obtaining the mean of the output of the spectral analyzer, said averaging means using the output of said first digital to analog converter as an input;
   digital delay means for delaying the output of said analog to digital converter using a second path, said digital delay means using the output of said analog to digital converter as an input;
   a second digital to analog converter for obtaining analog levels corresponding to the delayed output of said analog to digital converter, said second digital converter using as an input the output of said digital delay means;
   smoothing means for removing digital spikes in the output of said second digital to analog converter and thus obtaining delayed output of said spectral analyzer, said smoothing means using the output said second digital to converter as an input;
   timing means for controlling the sampling rate of the output of the spectral analyzer in the second path, said timing means being connected to said analog to digital converter and said digital delay means; and
   canceling means for canceling the mean of the output of the spectral analyzer traveling said first path from the delayed output of the spectral analyzer traveling said second path to obtain a normalizer output for displaying on the intensity modulated display, said canceling means using the outputs of said averaging means and said smoothing means as inputs.

2. The normalizer of claim 1 wherein said averaging means for averaging the output of said first digital to analog converter includes a first low pass filter having a low cutoff frequency.

3. The normalizer of claim 2 wherein said smoothing means for removing digital spikes introduced by said digital delay means in the output of said second digital to analog converter includes a second low pass filter having cutoff frequency substantially higher than the cutoff frequency of said first low pass filter.

4. The normalizer of claim 3 wherein said canceling means for canceling the mean of the output of the spectral analyzer from the delayed output from the spectral analyzer includes a first variable resistor in said first path of the mean of the output of the spectral analyzer and said second variable resistor in a second path of the delayed output of the spectral analyzer and a second amplifying means for amplifying the difference of the mean of the output of the spectral analyzer and the delayed output of the spectral analyzer.

5. A method of normalizing a spectral analyzer's output for displaying on an intensity modulated display by using an electronic hardware circuitry comprising the steps of:
   obtaining the mean of the output of the spectral analyzer by using an analog averager of said electronic circuitry in a first path;
   delaying the output of the spectral analyzer using a digital delay line of said electronic circuitry in a second path; and
   summing in an analog summer of said electronic circuitry the mean of the output of the spectral analyzer traveling said first path and the delayed output of the spectral analyzer traveling said second path to obtain the normalized output signal.

6. The method of claim five which further includes the step of digitizing the output of the spectral analyzer before finding the mean thereof using said first path and before delaying thereof using said second path.

* * * * *